(12) United States Patent
Suzuki et al.

(10) Patent No.: US 11,545,564 B2
(45) Date of Patent: Jan. 3, 2023

(54) SEMICONDUCTOR DEVICE

(71) Applicant: Mitsubishi Electric Corporation, Tokyo (JP)

(72) Inventors: Kenji Suzuki, Tokyo (JP); Koichi Nishi, Tokyo (JP); Katsumi Nakamura, Tokyo (JP); Ze Chen, Tokyo (JP); Koji Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/336,012

(22) Filed: Jun. 1, 2021

(65) Prior Publication Data
US 2022/0059681 A1 Feb. 24, 2022

(30) Foreign Application Priority Data
Aug. 20, 2020 (JP) .............................. JP2020-139105

(51) Int. Cl.
| | |
|---|---|
| *H01L 29/739* | (2006.01) |
| *H01L 29/66* | (2006.01) |
| *H01L 29/06* | (2006.01) |

(52) U.S. Cl.
CPC ...... *H01L 29/7397* (2013.01); *H01L 29/0696* (2013.01); *H01L 29/66348* (2013.01)

(58) Field of Classification Search
CPC ............. H01L 29/7397; H01L 29/0696; H01L 29/66348
USPC ....................................................... 257/139
See application file for complete search history.

(56) References Cited

U.S. PATENT DOCUMENTS

| | | | |
|---|---|---|---|
| 2015/0179441 A1 | 6/2015 | Onozawa | |
| 2017/0278929 A1 | 9/2017 | Imagawa | |
| 2018/0040540 A1* | 2/2018 | Kasuya | ..................... H02P 6/12 |
| 2020/0058506 A1 | 2/2020 | Nakamura | |

FOREIGN PATENT DOCUMENTS

| | | | |
|---|---|---|---|
| DE | 10 2019 211 745 A1 | 2/2020 | |
| WO | 2014/065080 A1 | 5/2014 | |
| WO | 2016/204126 A1 | 12/2016 | |
| WO | WO-2017115434 A1 * | 7/2017 | ........... H01L 21/041 |
| WO | WO-2017186788 A1 * | 11/2017 | |

OTHER PUBLICATIONS

An Office Action mailed by the German Patent Office dated Sep. 27, 2022, which corresponds to German Patent Application No. 10 2021 119 689.2 and is related to U.S. Appl. No. 17/336,012.

* cited by examiner

*Primary Examiner* — Igwe U Anya
(74) *Attorney, Agent, or Firm* — Studebaker & Brackett PC

(57) ABSTRACT

A semiconductor device includes an N-type drift layer provided between a first main surface and a second main surface of the semiconductor substrate and an N-type buffer layer provided between the N-type drift layer and the first main surface and having a higher impurity peak concentration than the N-type drift layer. The N-type buffer layer has a structure that a first buffer layer, a second buffer layer, a third buffer layer, and a fourth buffer layer are disposed in this order from a side of the first main surface. When a distance from an impurity peak position of the first buffer layer to an impurity peak position of the second buffer layer is L12 and a distance from an impurity peak position of the second buffer layer to an impurity peak position of the third buffer layer is L23, a relationship of L23/L12≥3.5 is satisfied.

12 Claims, 19 Drawing Sheets

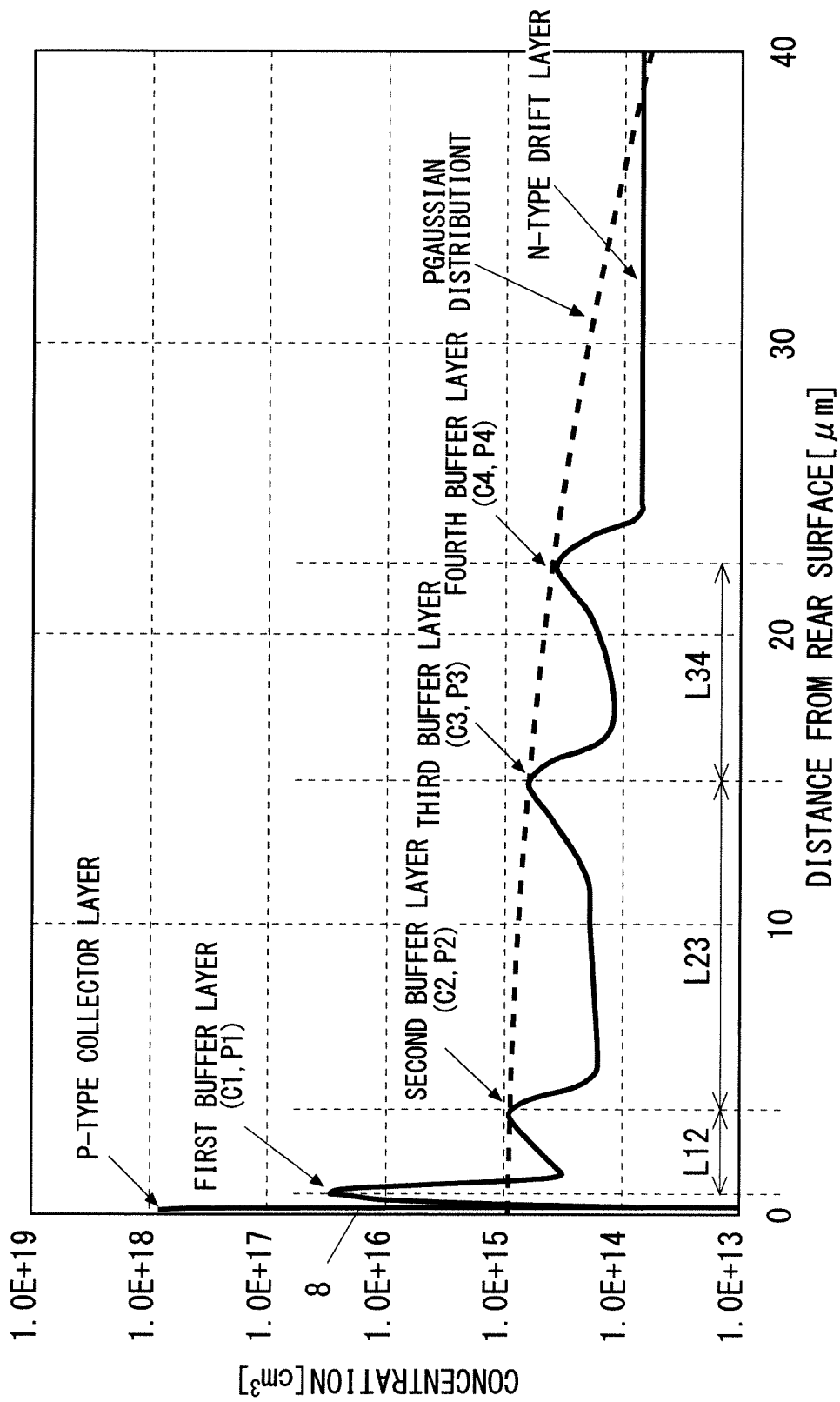
F I G. 2

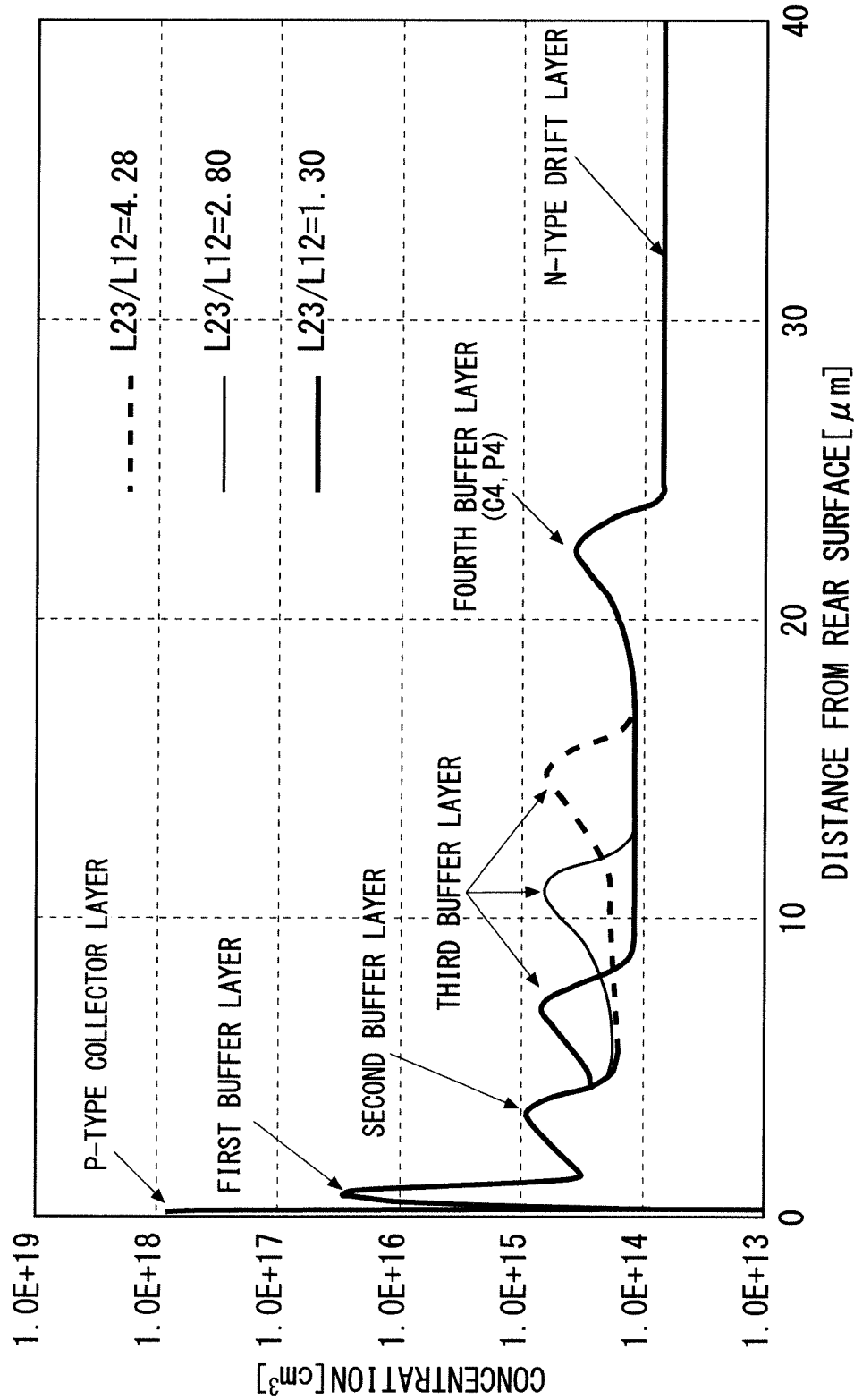
F I G. 3

F I G. 6
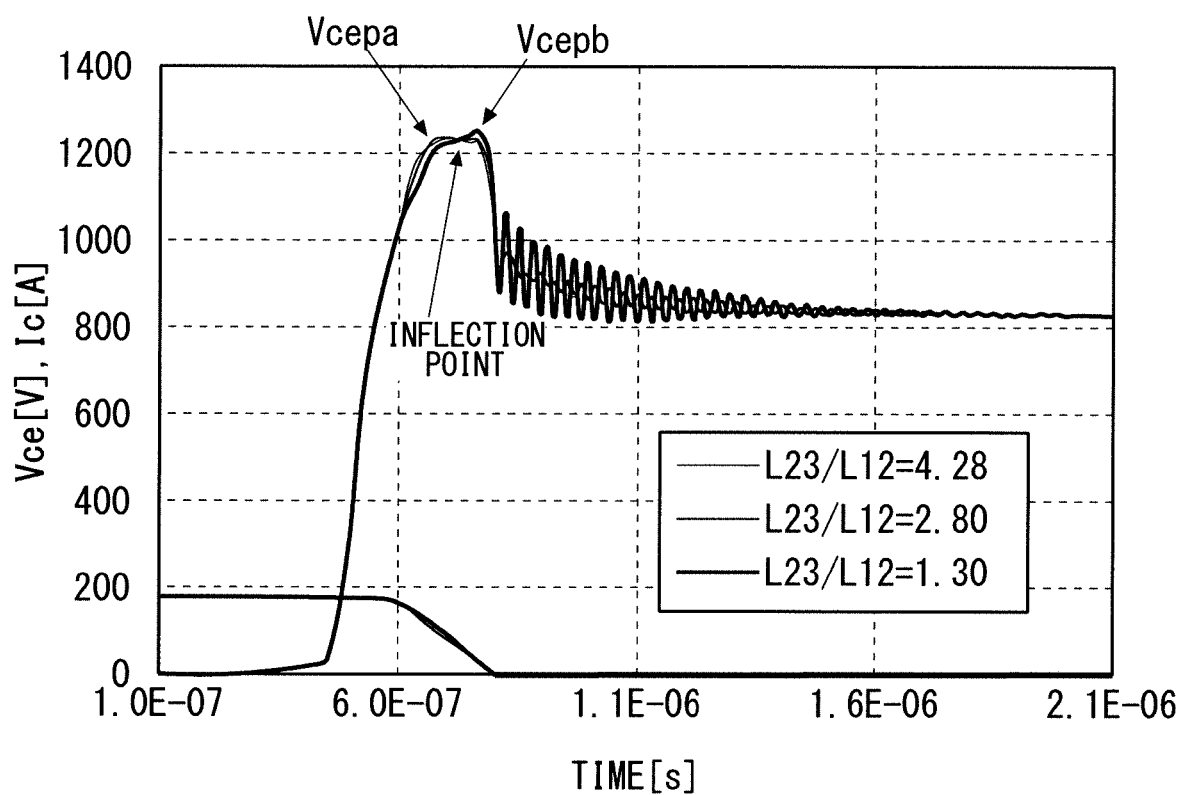

F I G. 8
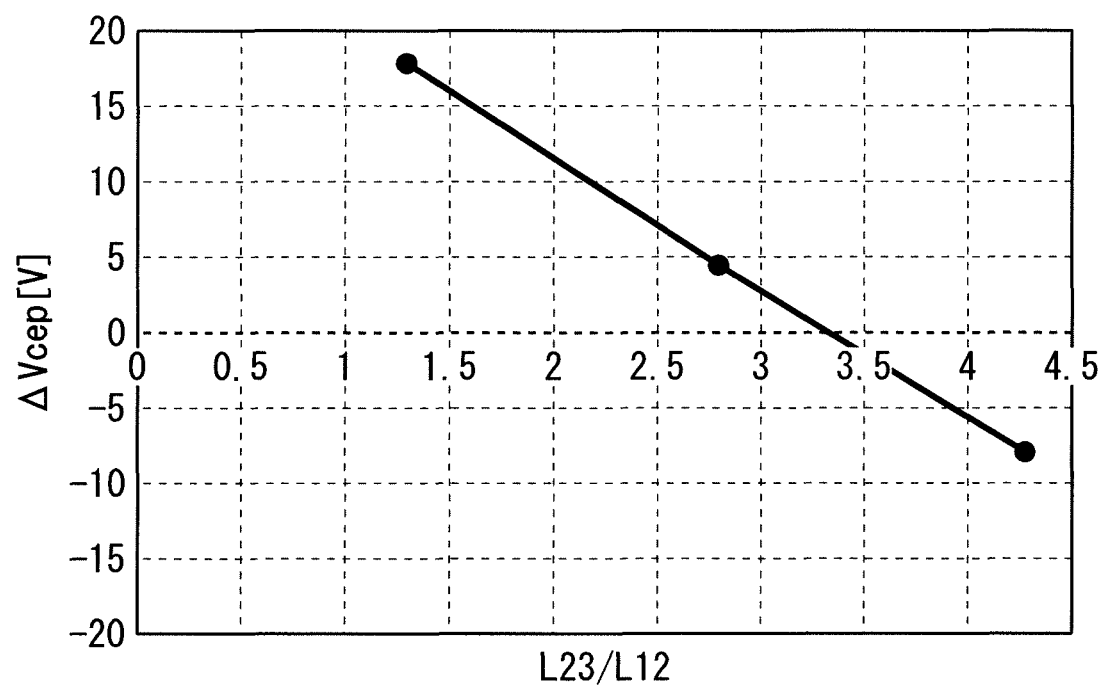

SEMICONDUCTOR DEVICE

BACKGROUND OF THE INVENTION

Field of the Invention

The present disclosure relates to a semiconductor device.

Description of the Background Art

In a general vertical semiconductor device, when voltage is applied in a vertical direction, an extension of a depletion layer from an interface between a P-type region and an N-type region formed on a side of a front surface of the semiconductor device to a side of a rear surface thereof needs to be stopped at a specific depth to suppress an occurrence of surge voltage at a time of transition from a conduction state to a non-conduction state of the semiconductor device (that is to say, at a time of turn off) and a vibration (oscillation) of voltage applied to the semiconductor device caused by the surge voltage. A technique of implanting protons into the side of the rear surface of a semiconductor device to form a buffer layer is known as a technique for stopping a depletion layer at a specific depth (for example, International Publication Nos. 2016/204126 and 2014/065080).

Protons are activated (converted into donor) by thermal processing of approximately 400° C., however, an activation rate thereof is approximately 1%. Thus, a large amount of protons needs to be implanted to form the buffer layer in the semiconductor device. The implantation amount of protons which are required can be reduced by forming the buffer layer using phosphorus having a high activation rate in addition to protons, however, there is still a problem that the occurrence of the surge voltage at the time of turn off and the oscillation of voltage cannot be sufficiently suppressed unless a concentration distribution of protons is optimized.

SUMMARY

An object of the present disclosure is to provide a semiconductor device including a buffer layer capable of gradually stopping an extension of a depletion layer at a time of applying voltage using a low concentration of protons.

A semiconductor device according to the present disclosure includes: a drift layer of a first conductivity type provided between a first main surface and a second main surface of a semiconductor substrate; and a buffer layer of a first conductivity type provided between the drift layer and the first main surface and having a higher impurity peak concentration than the drift layer. The buffer layer has a structure that a first buffer layer, a second buffer layer, a third buffer layer, and a fourth buffer layer are disposed in this order from a side of the first main surface. When a distance from an impurity peak position of the first buffer layer to an impurity peak position of the second buffer layer is L12 and a distance from an impurity peak position of the second buffer layer to an impurity peak position of the third buffer layer is L23, a relationship of L23/L12≥3.5 is satisfied.

According to the semiconductor device of the present disclosure, the first buffer layer formed using phosphorus is included, thus a concentration of proton in the second buffer layer, the third buffer layer, and the fourth buffer layer formed using proton can be reduced. Furthermore, the number of the buffer layers and the distance between the buffer layers are set as described above, thus an extension of a depletion layer at a time of applying voltage can be gradually stopped.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 2 is a drawing illustrating a profile of an impurity concentration near a rear surface of a semiconductor substrate in the IGBT according to the embodiment 1.

FIG. 3 is a drawing illustrating a profile of an impurity concentration near rear surfaces of semiconductor substrates in three IGBTs on which a simulation has been performed.

FIG. 6 is a drawing illustrating a result of a simulation of emitter-collector voltage at the time of turn off of the three IGBTs on which the simulation has been performed.

FIG. 8 is a drawing illustrating a relationship between L23/L12 and ΔVcep of the IGBT according to the embodiment 1.

DESCRIPTION OF THE PREFERRED EMBODIMENTS

Embodiment 1

Figure 1:
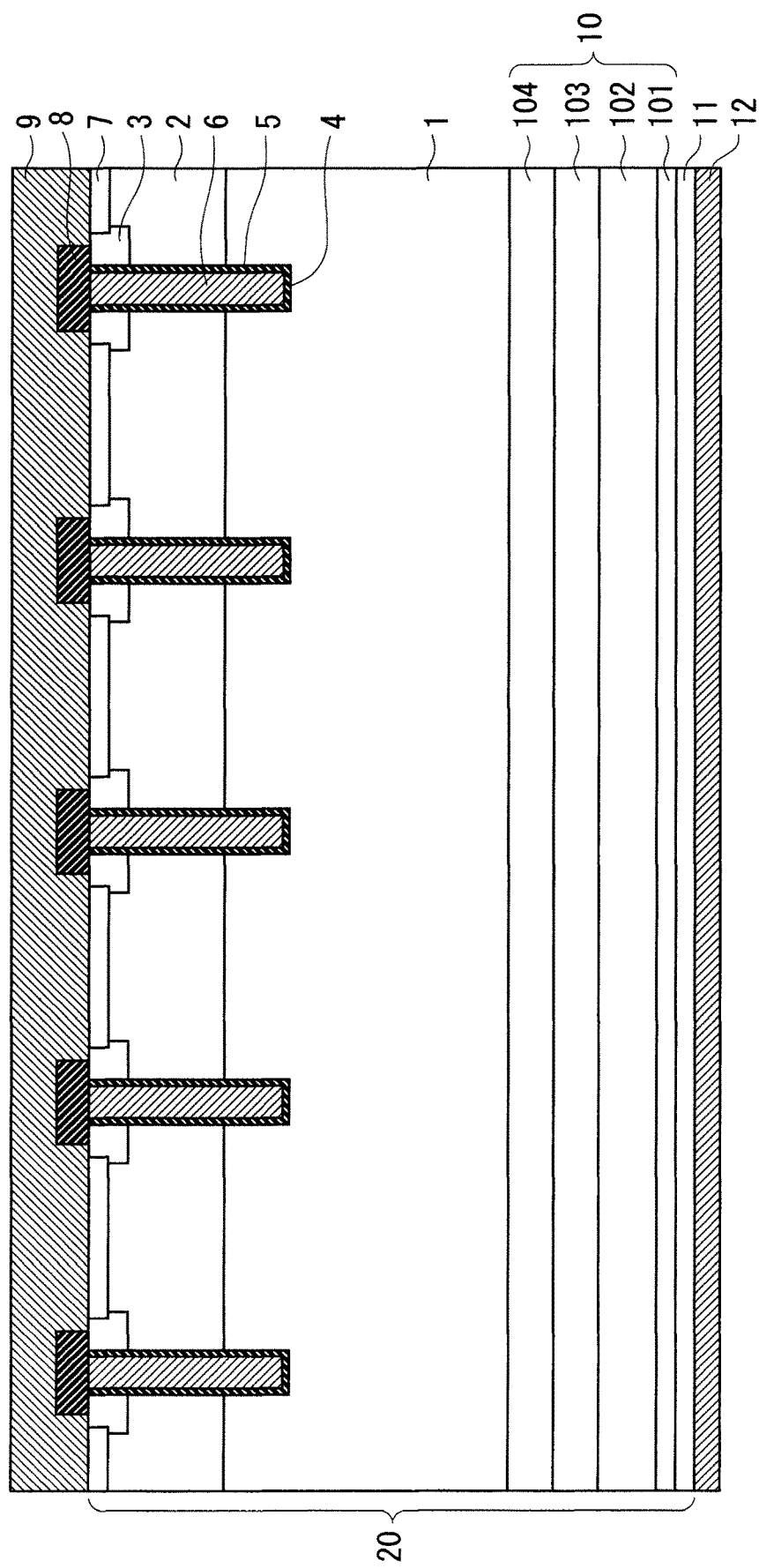
FIG. 1 is a cross-sectional view of a major part of an IGBT according to an embodiment 1.

FIG. 1 is a cross-sectional view of a major part of an IGBT which is a semiconductor device according to the embodiment 1. In the present embodiment, an IGBT of 1200 V withstand voltage class is described as an example the IGBT. In the description hereinafter, a first conductivity type is an N type and a second conductivity type is a P type.

As illustrated in FIG. 1, the IGBT is formed using a semiconductor substrate 20. General silicone may be applied to a material of the semiconductor substrate 20, or wideband gap semiconductor such as silicon carbide (SiC), Gallium nitride series material, and diamond is also applicable. When the wideband gap semiconductor is used as the semiconductor material, a semiconductor device excellent in operation under high voltage, large current, and high temperature compared with a case of using silicone can be obtained. A first main surface which is a lower side surface of the semiconductor substrate 20 in FIG. 1 is referred to as "a rear surface" and a second main surface which is an upper side surface is referred to as "a front surface" hereinafter.

An N-type drift layer 1 is formed in the semiconductor substrate 20. The semiconductor substrate 20 includes a P-type base layer 2 on a side of a front surface (a side of a second main surface) of the N-type drift layer 1. A peak value of an impurity concentration (referred to as "an impurity peak concentration" hereinafter) of the P-type base layer 2 is set to approximately $8.0 \times 10^{16}/cm^3$ to $5.0 \times 10^{17}/cm^3$ so that gate voltage at a time when current starts flowing from a collector to an emitter of the IGBT, that is to say, a threshold voltage is approximately 6 V.

The semiconductor substrate 20 includes an N-type emitter layer 3 having a higher impurity peak concentration than the N-type drift layer 1 and a $P^+$-type diffusion layer 7 having a higher impurity peak concentration than the P-type base layer 2 on a side of a front surface of the P-type base layer 2. These N-type emitter layer 3 and $P^+$-type diffusion layer 7 are disposed on a surface layer part of the front surface of the semiconductor substrate 20.

A trench 4 is formed in the front surface of the semiconductor substrate 20 to pass through the N-type emitter layer 3 and the P-type base layer 2 and reach the N-type drift layer 1. A gate insulating film 5 is formed in an inner surface (a side surface and a bottom surface) of the trench 4, and a gate electrode 6 is formed on the gate insulating film 5 to fill the trench 4.

An interlayer insulating film 8 is formed on the front surface of the semiconductor substrate 20 to cover the gate electrode 6, and an emitter electrode 9 is formed on the interlayer insulating film 8. A contact hole reaching the N-type emitter layer 3 and the $P^+$-type diffusion layer 7 is formed in the interlayer insulating film 8, and the emitter electrode 9 is connected to the N-type emitter layer 3 and the $P^+$-type diffusion layer 7 via the contact hole.

The semiconductor substrate 20 has an N-type buffer layer 10 having a higher impurity peak concentration than the N-type drift layer 1 on a side of a rear surface (a side of a first main surface) of the N-type drift layer 1. The semiconductor substrate 20 includes a P-type collector layer 11 on a side of a rear surface of the N-type buffer layer A collector electrode 12 connected to the P-type collector layer 11 is formed on the rear surface of the semiconductor substrate 20.

As illustrated in FIG. 1, the N-type buffer layer 10 has a structure that a first buffer layer 101, a second buffer layer 102, a third buffer layer 103, and a fourth buffer layer 104 are disposed in this order from a side of a rear surface of the semiconductor substrate 20. The first buffer layer 101 is formed by implanting phosphorus ions, and the second buffer layer 102, the third buffer layer 103, and the fourth buffer layer 104 are formed by implanting protons. The first buffer layer 101 has an effect of suppressing an occurrence of surge voltage at a time of turn off of the IGBT and an oscillation of voltage and an effect of reducing leakage current as with the second buffer layer 102, the third buffer layer 103, and the fourth buffer layer 104.

An activation rate of phosphorus by heating is approximately 70 to 100%, and an activation rate of proton by heating is approximately 0.5 to 2%. Thus, the first buffer layer 101 formed by implanting phosphorus ions can be formed in a small ion implantation amount and a short implantation time, and has an effect nearly equal to the buffer layer formed by implanting a large amount of protons for a long time. The N-type buffer layer 10 includes the first buffer layer 101, thus the implantation amount and the time of implantation of protons can be reduced compared with a case where the buffer layer is formed only with proton implantation. As a result, a processing efficiency of a proton implantation machine can be improved.

FIG. 2 illustrates an impurity concentration profile near the rear surface of the semiconductor substrate 20 (an impurity concentration profile of the P-type collector layer 11, the N-type buffer layer 10, and the N-type drift layer 1) in the IGBT according to the embodiment 1. In a semiconductor device of 1200V withstand voltage class, a specific resistance of the N-type drift layer 1 is 50 Ω·cm to 67 Ω·cm, for example. A sum of a thickness of the N-type drift layer 1 and a thickness of the N-type buffer layer 10 (a sum of a thickness of each of the first buffer layer 101, the second buffer layer 102, the third buffer layer 103, and the fourth buffer layer 104) is 100 μm to 130 μm, for example.

Herein, the impurity peak concentrations of the first buffer layer 101, the second buffer layer 102, the third buffer layer 103, and the fourth buffer layer 104 are referred to as C1, C2, C3, and C4, respectively. Positions of peaks of the impurity concentrations of the first buffer layer 101, the second buffer layer 102, the third buffer layer 103, and the fourth buffer layer 104 are referred to as P1, P2, P3, and P4, respectively. The position of peak of the impurity concentration expresses a distance (depth) from the rear surface of the semiconductor substrate 20, and is referred to as "the impurity peak position" hereinafter.

A distance from the impurity peak position P1 of the first buffer layer 101 to the impurity peak position P2 of the second buffer layer 102 is referred to as L12, a distance from the impurity peak position P2 of the second buffer layer 102 to the impurity peak position P3 of the third buffer layer 103 is referred to as L23, and a distance from the impurity peak position P3 of the third buffer layer 103 to the impurity peak position P4 of the fourth buffer layer 104 is referred to as L34. In the IGBT according to the embodiment 1, the N-type buffer layer 10 is made to satisfy a relationship of L23/L12≥3.5.

Performed is a device simulation for checking an effect by the N-type buffer layer 10 of the IGBT according to the embodiment 1. The simulation is performed on three IGBTs each having an impurity concentration profile near the rear surface of the semiconductor substrate 20 different from each other. FIG. 3 illustrates the impurity concentration profile near the rear surface of the semiconductor substrate 20 (the impurity concentration profile of the P-type collector layer 11, the N-type buffer layer 10, and the N-type drift layer 1) in each of the three IGBTs on which the simulation is performed. Values of L23/L12 in these three IGBTs are 4.28, 2.80, and 1.30, respectively.

Figure 4:
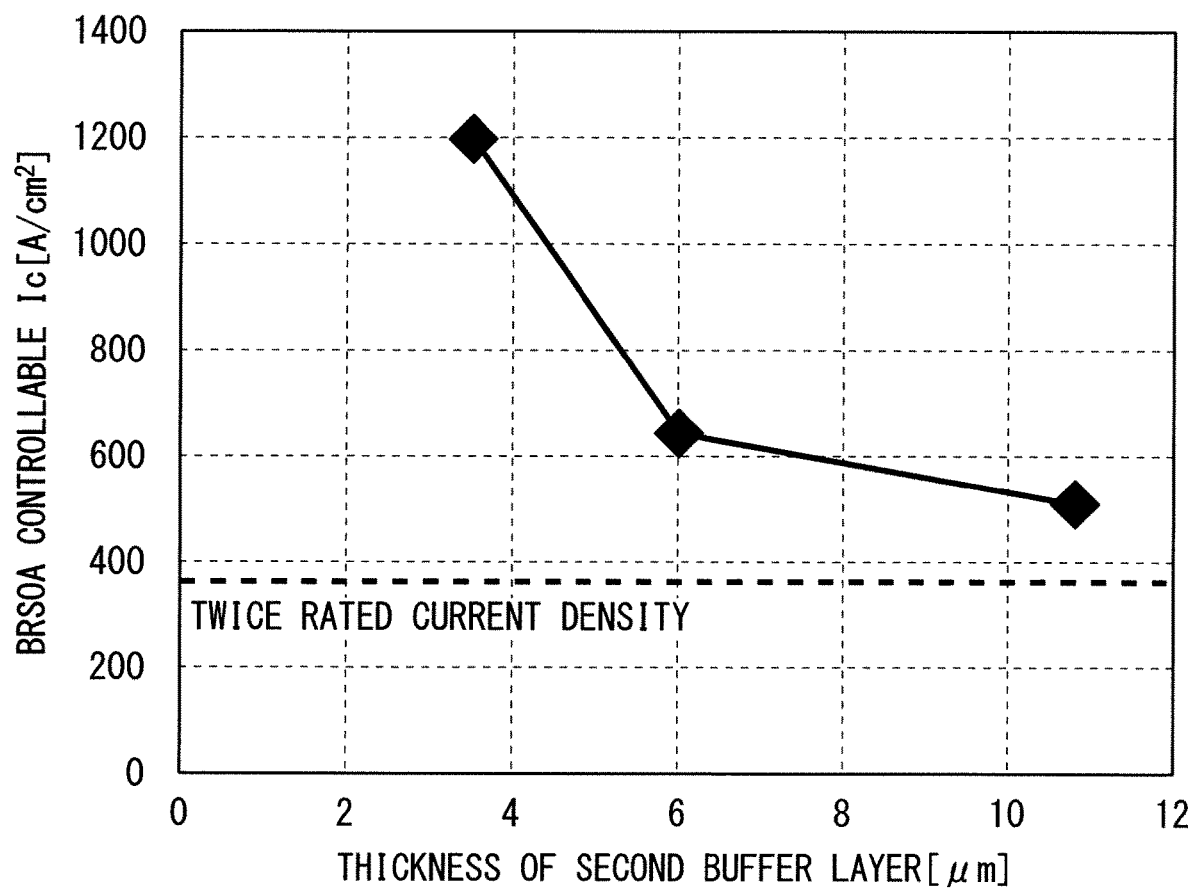
FIG. 4 is a drawing illustrating a relationship between a depth of a second buffer layer and current which can be controlled in an RBSOA.

Herein, L12 can be adjusted by the impurity peak position P2 of the second buffer layer 102 located closest to the rear surface of the semiconductor substrate 20 in the buffer layer formed using protons. However, as illustrated in FIG. 4, when the second buffer layer 102 is formed deep and a distance from the impurity peak position P1 of the first buffer layer 101 formed using phosphorus to the impurity peak position P2 of the second buffer layer 102 is increased, current which can be controlled by reverse bias safe operating area (RBSOA) test for examining a breakdown strength of the IGBT decreases. This condition may cause a breakdown of a device when overcurrent flows during an actual operation Thus, a length of L12 is fixed to approximately 3.5 µm in the simulation. However, the effect of suppressing the surge voltage similar to that in the simulation result can be expected even when the impurity peak position P1 of the first buffer layer 101 is 0.5 µm to 2 µm, the impurity peak concentration C1 thereof is $1.0 \times 10^{16}/cm^3$ to $1.0 \times 10^{17}/cm^3$, the impurity peak position P2 of the second buffer layer 102 is 2 µm to 6 µm, and the impurity peak concentration C2 thereof is $5.0 \times 10^{14}/cm^3$ to $2.0 \times 10^{15}/cm^3$.

The impurity peak position P4 of the fourth buffer layer 104 is determined by a limitation of acceleration voltage of an implantation machine, thus is set as a fixed value in the simulation. Thus, a value of L23+L34 is a fixed value in the simulation. However, the effect similar to that in the simulation result can be expected even when the impurity peak position P4 of the fourth buffer layer 104 is 20 µm to 40 µm and the impurity peak concentration C4 thereof is $1.0 \times 10^{14}/cm^3$ to $1.0 \times 10^{14}/cm^3$.

Figure 5:
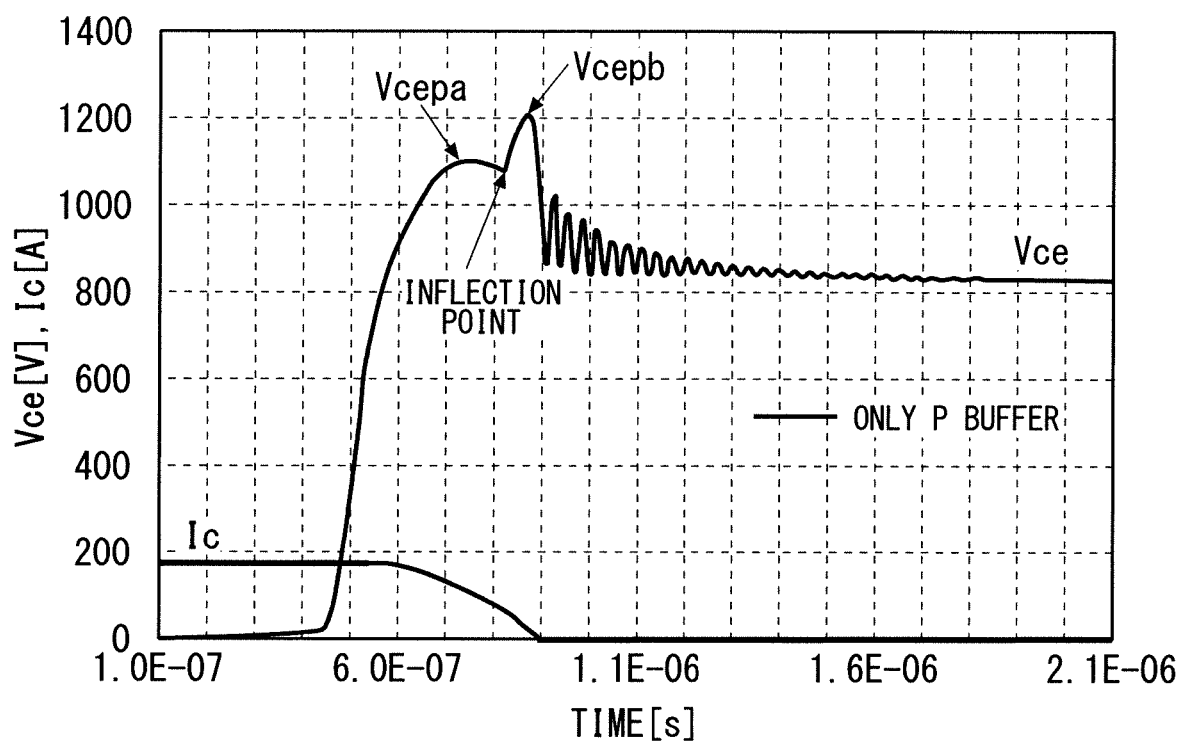
FIG. 5 is a drawing illustrating a result of a simulation of a waveform of emitter-collector voltage at a time of turn off of the IGBT in which an N-type buffer layer is made up of only a first buffer layer.

FIG. 5 illustrates a result of simulation of a waveform of an emitter-collector voltage (Vce) at a time of turn-off of an IGBT in which the N-type buffer layer 10 is made up of only the first buffer layer 101. In a case where the N-type buffer layer 10 is made up of only the first buffer layer 101, the depletion layer reaches the side of the rear surface at a time when Vce reaches around a peak once and an inflection point appears, thus large surge voltage and a horn (bounce) of voltage occurs in the emitter-collector voltage Vce. This bounce of Vce causes withstand voltage breakdown of the semiconductor device. Thus, a difference between values of peak voltage of Vce before and after the inflection point appears as an index of evaluating a presence or absence of the bounce of Vce. That is to say, ΔVcep=Vcepb−Vcepa is calculated, wherein the peak voltage of Vce before the inflection point appears is Vcepa and the peak voltage of Vce after the inflection point appears is Vcepb. When ΔVcep takes a positive value, it is evaluated that there is a bounce of voltage, and when ΔVcep takes a value equal to or smaller than 0, it is evaluated that there is no bounce of voltage.

Figure 7:
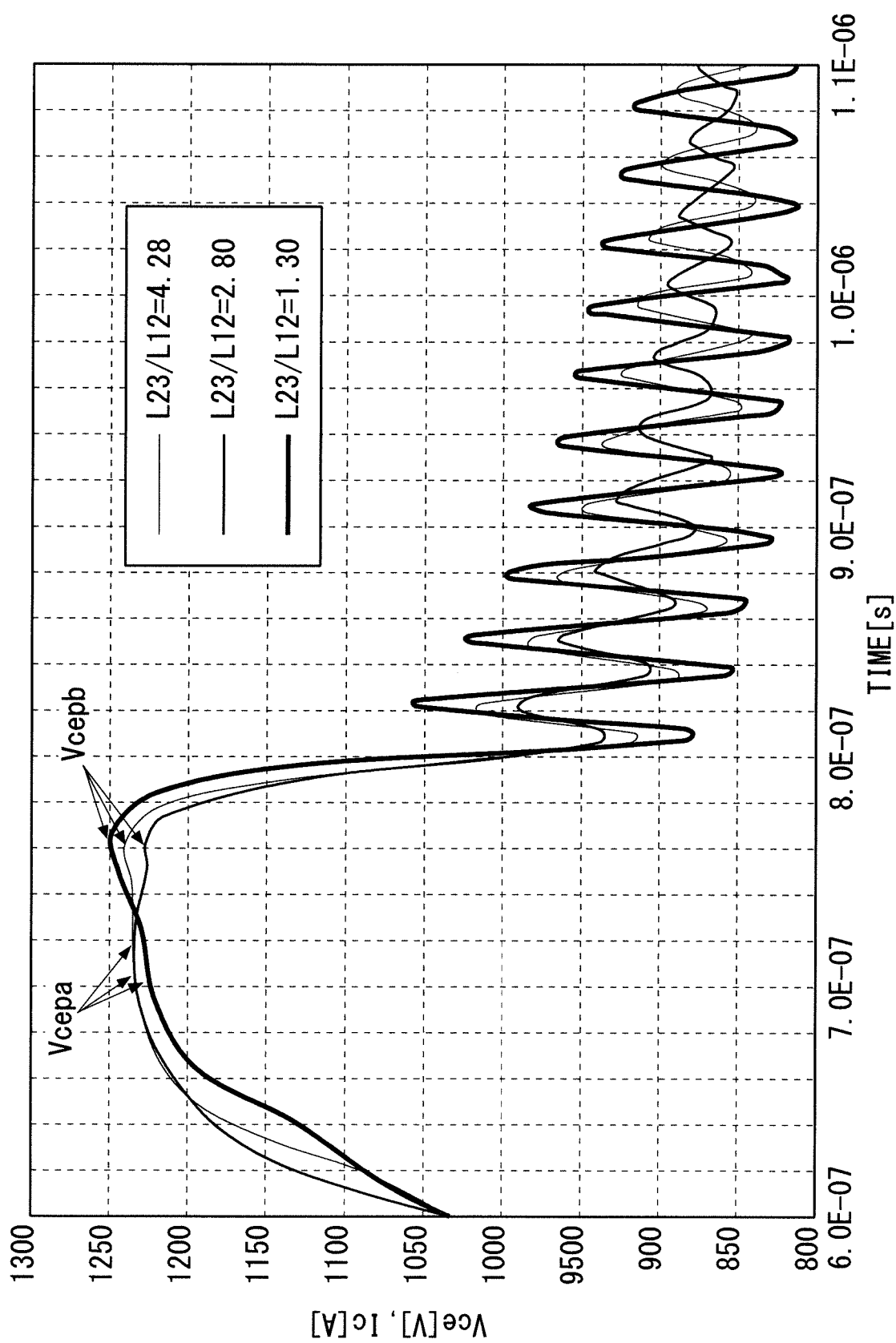
FIG. 7 is a drawing of enlarging part of FIG. 6.

FIG. 6 is a simulation result of the emitter-collector voltage (Vce) at the time of turn off of the three IGBTs illustrated in FIG. 3, and FIG. 7 is a partially-enlarged view thereof. FIG. 8 illustrates a relationship between L23/L12 and ΔVcep obtained from the simulation result. As recognized from FIG. 8, when L23/L12 is equal to or larger than 3.5, ΔVcep takes a negative value, and a bounce of Vce is suppressed.

Figure 9:
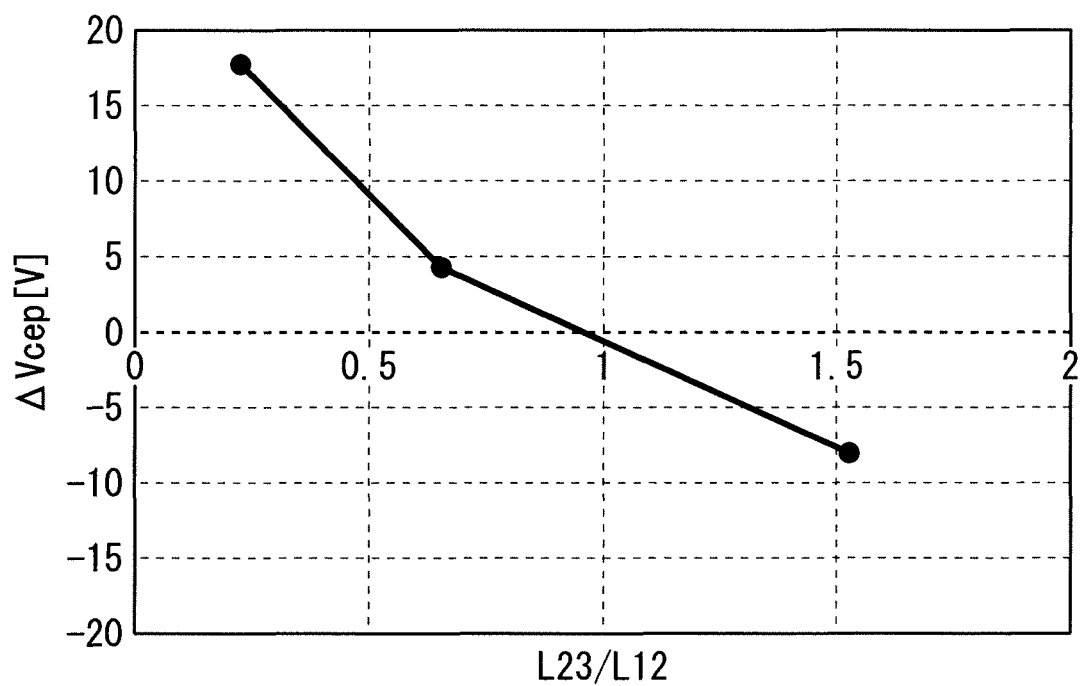
FIG. 9 is a drawing illustrating a relationship between L23/L34 and ΔVcep of the IGBT according to the embodiment 1.

FIG. 9 illustrates a relationship between L23/L34 and ΔVcep. As recognized from FIG. 9, when L23/L34 is equal to or larger than 1, ΔVcep takes a negative value, and a bounce of Vce is suppressed.

The impurity peak concentrations C2, C3, and C4 of the second buffer layer 102, the third buffer layer 103, and the fourth buffer layer 104, respectively, preferably satisfy a relationship of C2>C3>C4 to suppress the surge voltage at the time of turn off. It is preferable that the impurity peak concentration C1 of the first buffer layer 101 is $1.0 \times 10^{16}/cm^3$ to $1.0 \times 10^{17}/cm^3$, the impurity peak concentration C2 of the second buffer layer 102 is $5.0 \times 10^{14}/cm^3$ to $2.0 \times 10^{15}/cm^3$, and the impurity peak concentration C3 of the third buffer layer 103 is $2.0 \times 10^{14}/cm^3$ to $1.5 \times 10^{15}/cm^3$, and the impurity peak concentration C4 of the fourth buffer 104 is $1.0 \times 10^{14}/cm^3$ to $1.0 \times 10^{15}/cm^3$.

The impurity concentration in a depth between the impurity peak position P2 of the second buffer layer 102 and the impurity peak position P3 of the third buffer layer 103 and the impurity concentration in a depth between the impurity peak position P3 of the third buffer layer 103 and the impurity peak position P4 of the fourth buffer layer 104 are preferably higher than the impurity concentration of the N-type drift layer 1 to dissolve a crystal defect region.

When an extension of the impurity in the first buffer layer 101, the second buffer layer 102, the third buffer layer 103, and the fourth buffer layer 104 in a depth direction is evaluated with a half-value width in which the impurity concentration is half the peak (referred to as "the impurity half-value width" hereinafter), an impurity half-value width W1 of the first buffer layer 101 is approximately 0.3 µm, an impurity half-value width W2 of the second buffer layer 102 is approximately 2.0 µm, an impurity half-value width W3 of the third buffer layer 103 is approximately 2.4 µm, and an impurity half-value width W4 of the fourth buffer layer 104 is approximately 2.9 µm. The impurity half-value widths W1, W2, W3, and W4 of the first buffer layer 101, the second buffer layer 102, the third buffer layer 103, and the fourth buffer layer 104, respectively, satisfy a relationship of W1<W2<W3<W4.

In this manner, the first buffer layer 101, the second buffer layer 103, the third buffer layer 103, and the fourth buffer layer 104 have the higher impurity peak concentration and the smaller extension of the impurity in the depth direction (the impurity half-value width) as they are located closer to the side of the rear surface of the semiconductor substrate 20. Particularly, an envelope curve connecting the impurity peak concentrations C2, C3, and C4 of the second buffer layer 102, the third buffer layer 103, and the fourth buffer layer 104 formed using the same impurity (proton) is close to Gaussian distribution expressed by the following expression.

$$C(x, t) = \frac{S}{\sqrt{\pi Dt}} \exp\left(-\frac{x^2}{4Dt}\right) \qquad \text{[Expression 1]}$$

In the above expression, C indicates a dopant concentration per unit area, D indicates a diffusion coefficient, S indicates a dopant total amount per unit area, t indicates a time, and x indicates a depth from the rear surface of the semiconductor substrate 20. When the second buffer layer 102, the third buffer layer 103, and the fourth buffer layer 104 satisfy this relationship, the effect of suppressing the surge voltage at the time of turn off is obtained even if the impurity peak concentrations C2, C3, and C4 are reduced. Thus, a processing efficiency of a proton implantation machine can be improved by reducing the implantation amount of protons. Specifically, the impurity peak concentrations C2, C3, and C4 of the second buffer layer 102, the third buffer layer 103, and the fourth buffer layer 104 may be equal to or smaller than $2.0 \times 10^{15}/cm^3$.

When the N-type buffer layer 10 satisfies a relationship of L23/L12≧3.5, it is confirmed by the simulation that a semiconductor device having at least one of configurations (a) to (g) described hereinafter has an effect of suppressing the surge voltage inducing an oscillation of turn off.

(a) Withstand voltage is equal to or smaller than 750V, a specific resistance of the N-type drift layer 1 is equal to or larger than 20 Ω·cm and equal to or smaller than 40 Ω·cm, and a sum of a thickness of the N-type drift layer 1 and a thickness of the N-type buffer layer 10 is equal to or larger than 50 µm and equal to or smaller than 80 µm, (b) Withstand voltage is 1200V, a specific resistance of the N-type drift layer 1 is equal to or larger than 50 Ω·cm and equal to or smaller than 90 Ω·cm, and a sum of a thickness of the N-type drift layer 1 and a thickness of the N-type buffer layer 10 is equal to or larger than 100 µm and equal to or smaller than 130 µm, (c) Withstand voltage is 1700V, a specific resistance of the N-type drift layer 1 is equal to or larger than 90 Ω·cm and equal to or smaller than 130 Ω·cm, and a sum of a thickness of the N-type drift layer 1 and a thickness of the N-type buffer layer 10 is equal to or larger than 170 µm and equal to or smaller than 210 µm, (d) Withstand voltage is 2000V, a specific resistance of the N-type drift layer 1 is equal to or larger than 130 Ω·cm and equal to or smaller than 180 Ω·cm, and a sum of a thickness of the N-type drift layer 1 and a thickness of the N-type buffer layer 10 is equal to or larger than 200 µm and equal to or smaller than 260 µm, (e) Withstand voltage is 3300V, a specific resistance of the N-type drift layer 1 is equal to or larger than 200 Ω·cm and equal to or smaller than 350 Ω·cm, and a sum of a thickness of the N-type drift layer 1 and a thickness of the N-type buffer layer 10 is equal to or larger than 340 µm and equal to or smaller than 420 µm, (f) Withstand voltage is 4500V, a specific resistance of the N-type drift layer 1 is equal to or larger than 300 Ω·cm and equal to or smaller than 450 Ω·cm, and a sum of a thickness of the N-type drift layer 1 and a thickness of the N-type buffer layer 10 is equal to or larger than 420 µm and equal to or smaller than 540 µm, and (g) Withstand voltage is 6500V, a specific resistance of the N-type drift layer 1 is equal to or larger than 600 Ω·cm and equal to or smaller than 900 Ω·cm, and a sum of a thickness of the N-type drift layer 1 and a thickness of the N-type buffer layer 10 is equal to or larger than 580 µm and equal to or smaller than 720 µm.

The thickness of the N-type buffer layer 10 is equal to a sum of each thickness of the first buffer layer 101, the second buffer layer 102, the third buffer layer 103, and the fourth buffer layer 104.

A method of manufacturing the IGBT according to the embodiment 1 is described herein. A method of forming a structure of the side of the front surface of the semiconductor substrate 20 may be the same as the method of manufacturing a known IGBT, thus described herein is a method of forming a structure of the side of the rear surface of the semiconductor substrate 20 (the N-type buffer layer 10, the P-type collector layer 11, and the collector electrode 12).

Figure 10:
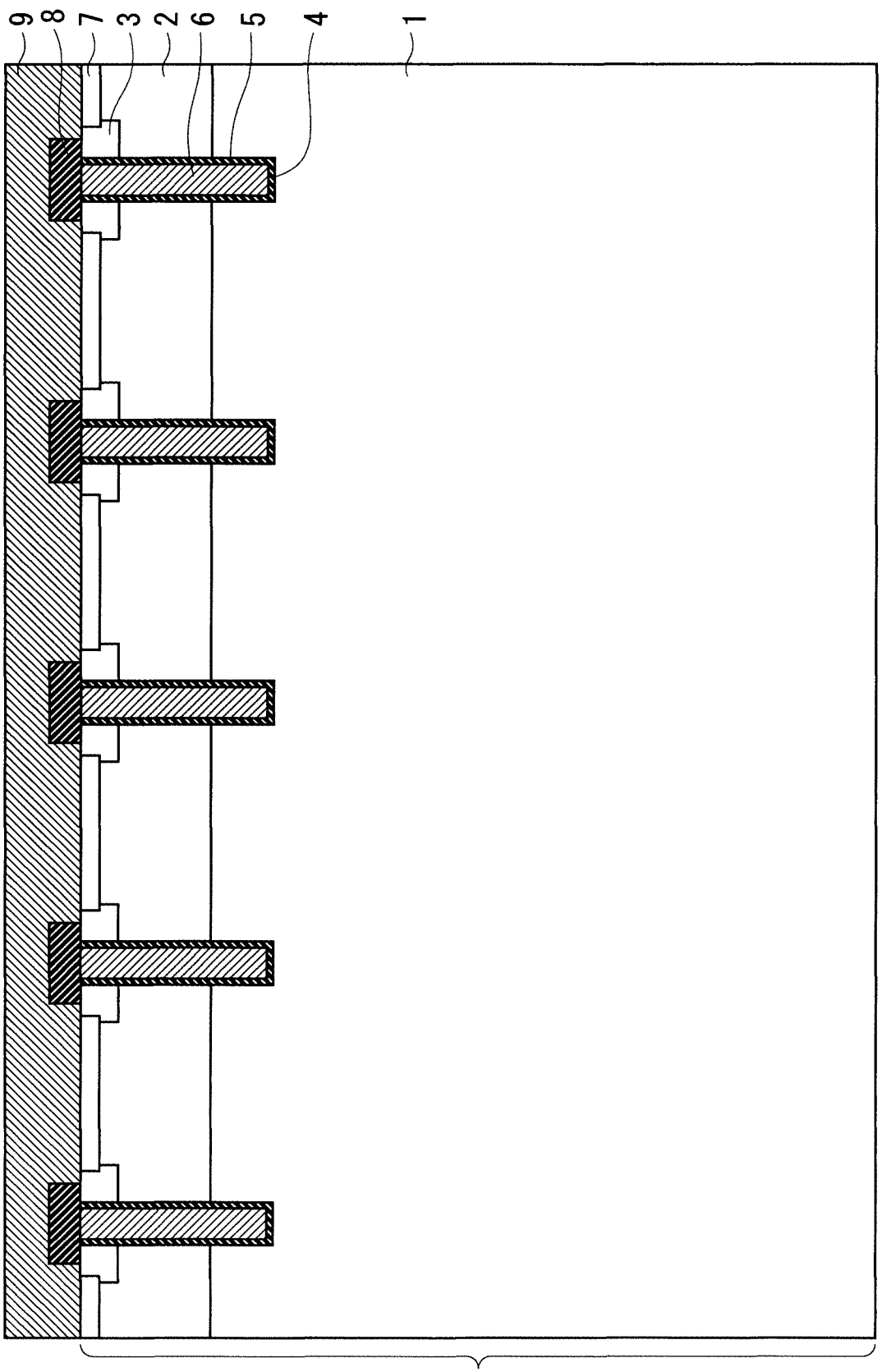
FIG. 10 is a drawing of a process of manufacturing the IGBT according to the embodiment 1.
Figure 11:
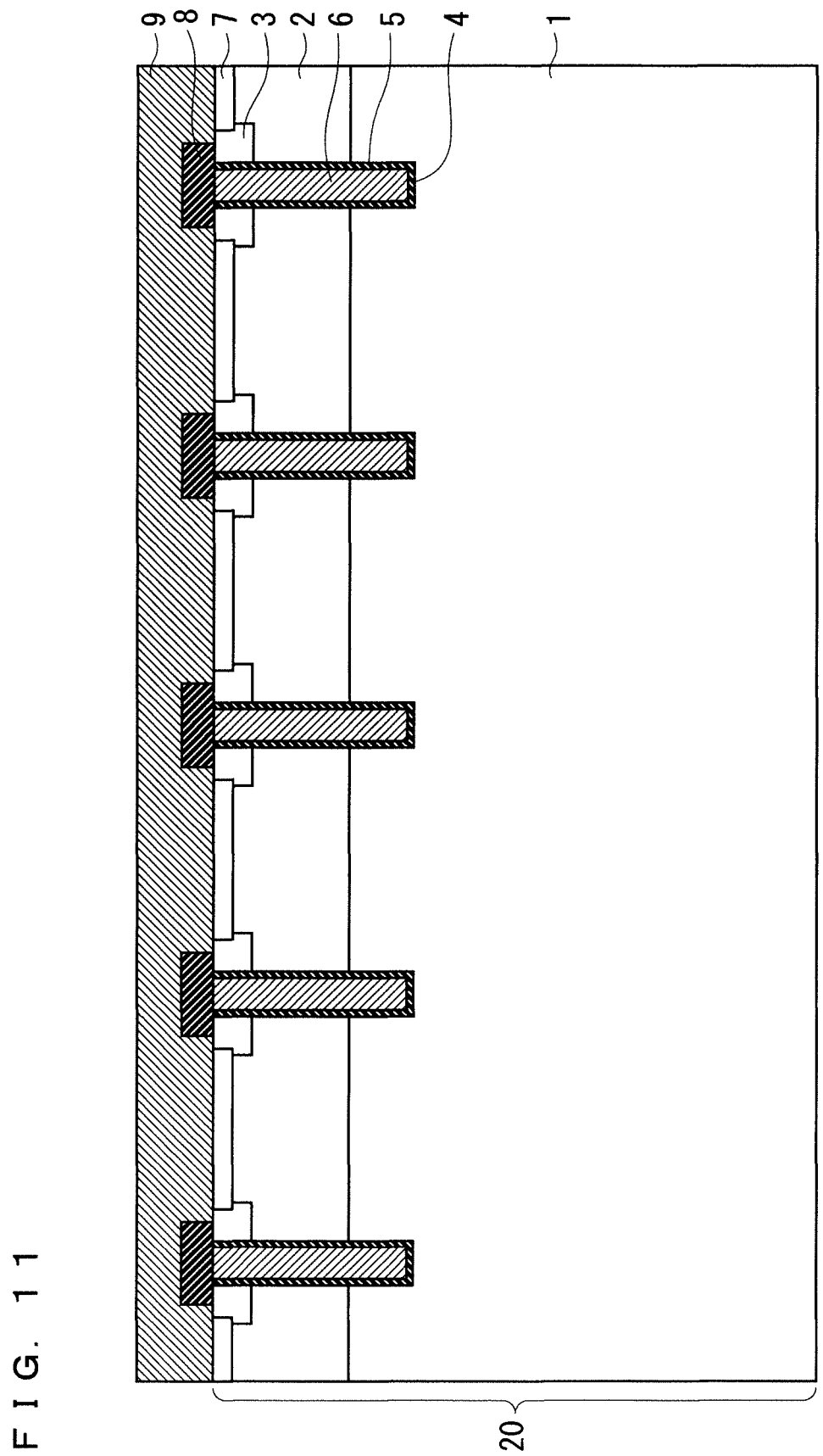
FIG. 11 is a drawing of a process of manufacturing the IGBT according to the embodiment 1.

FIG. 10 illustrates a state where a process of forming the side of the front surface of the semiconductor substrate 20 is completed. At this point of time, the thickness of the semiconductor substrate 20 (wafer) is substantially the same as a bare wafer, that is approximately 700 µm. The side of the rear surface of the semiconductor substrate 20 in the state illustrated in FIG. 10 is ground by a grinder or wet etching to reduce the thickness of the semiconductor substrate 20 to a desired thickness.

Figure 12:
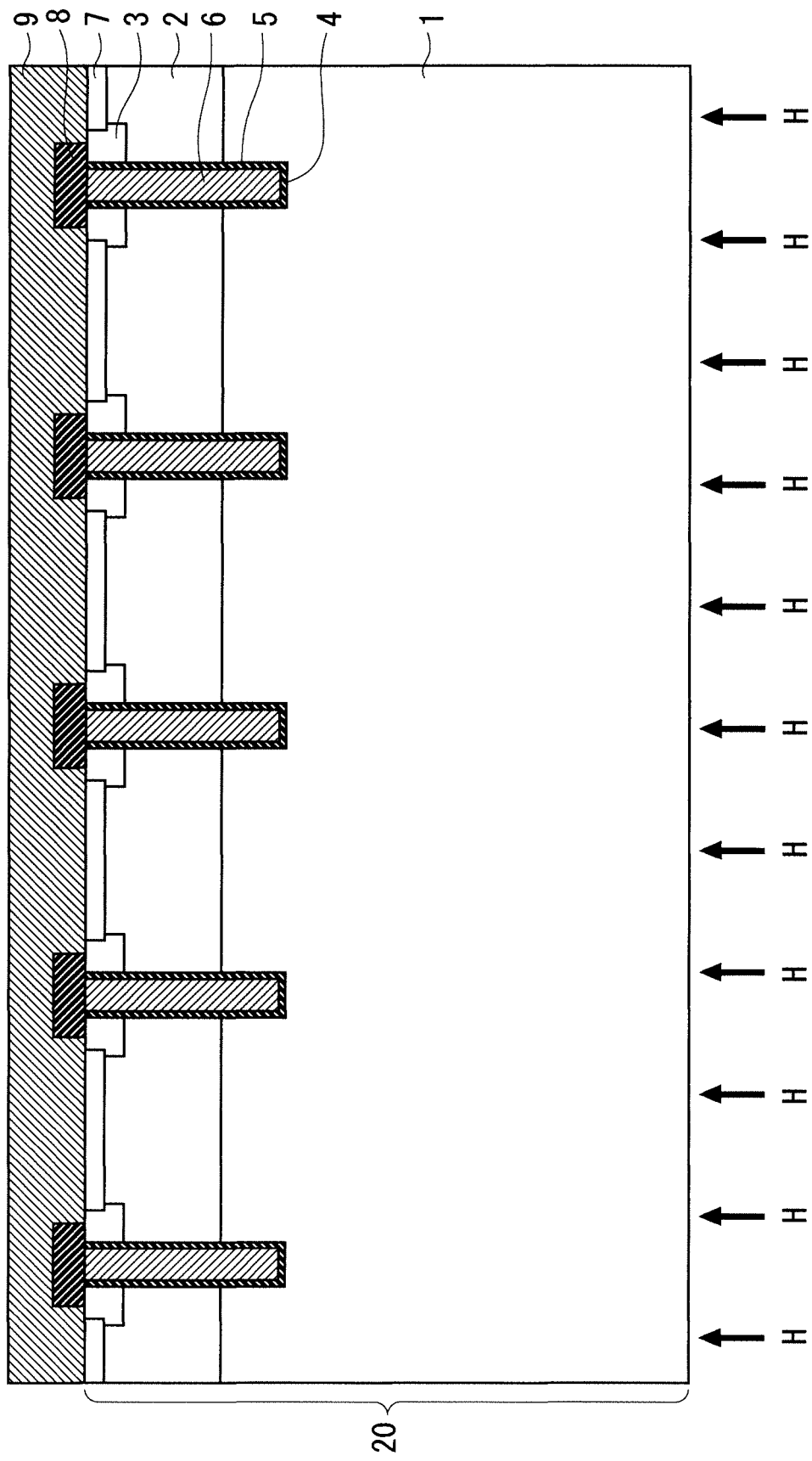
FIG. 12 is a drawing of a process of manufacturing the IGBT according to the embodiment 1.

Subsequently, as illustrated in FIG. 12, protons for forming the second buffer layer 102, the third buffer layer 103, and the fourth buffer layer 104 are implanted from the rear surface of the semiconductor substrate 20. At this time, acceleration voltage of proton implantation is changed with three levels, thus protons are implanted in depths corresponding to the second buffer layer 102, the third buffer layer 103, and the fourth buffer layer 104, respectively. Alternatively, the implantation depth of protons may be controlled by changing an implantation angle or using an absorber without changing the acceleration voltage, and in that case, an implantation time can also be reduced.

Figure 13:
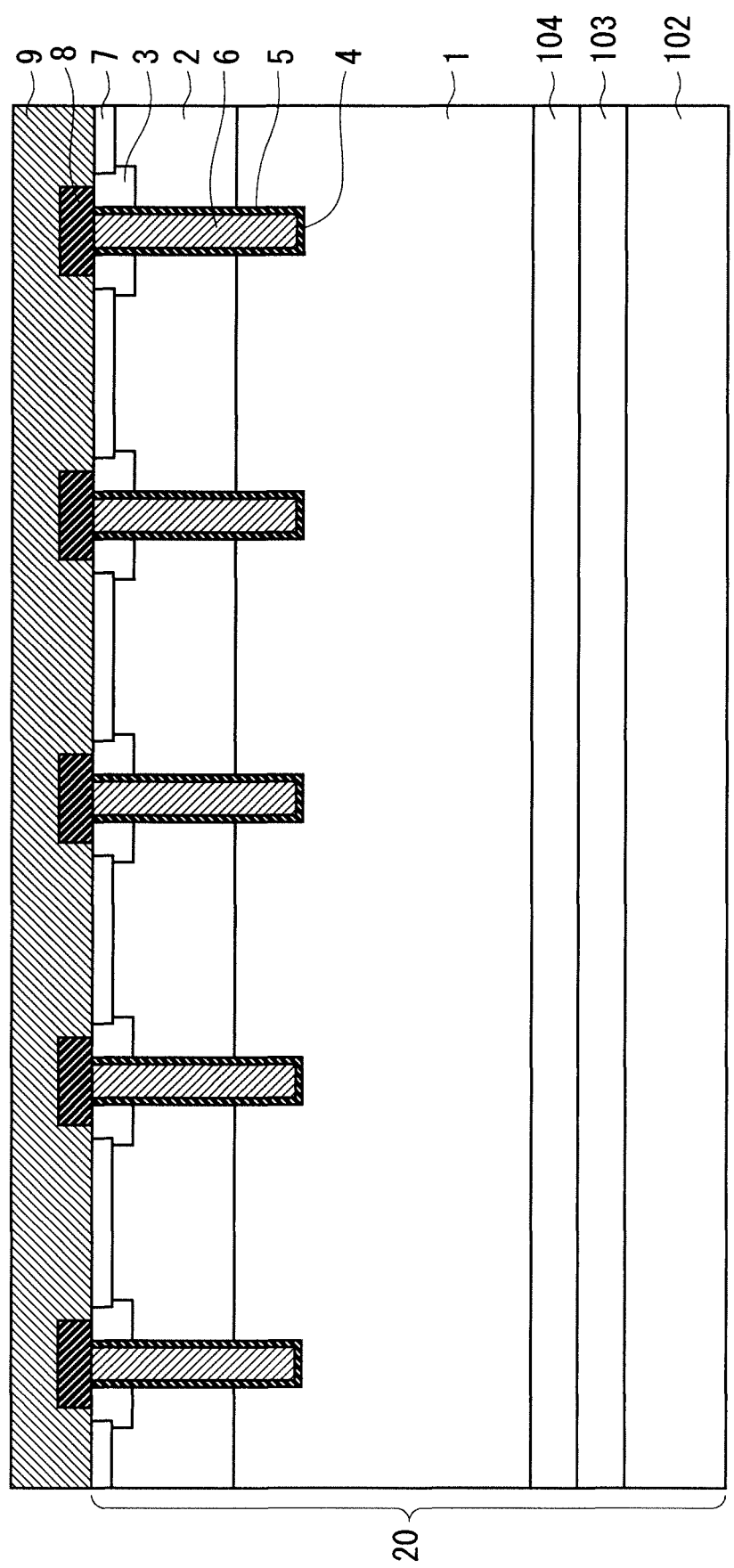
FIG. 13 is a drawing of a process of manufacturing the IGBT according to the embodiment 1.

Subsequently, furnace annealing is performed at approximately 300° C. to 500° C. to activate the implanted protons. Accordingly, as illustrated in FIG. 13, the second buffer layer 102, the third buffer layer 103, and the fourth buffer layer 104 are formed in depths different from each other.

Figure 14:
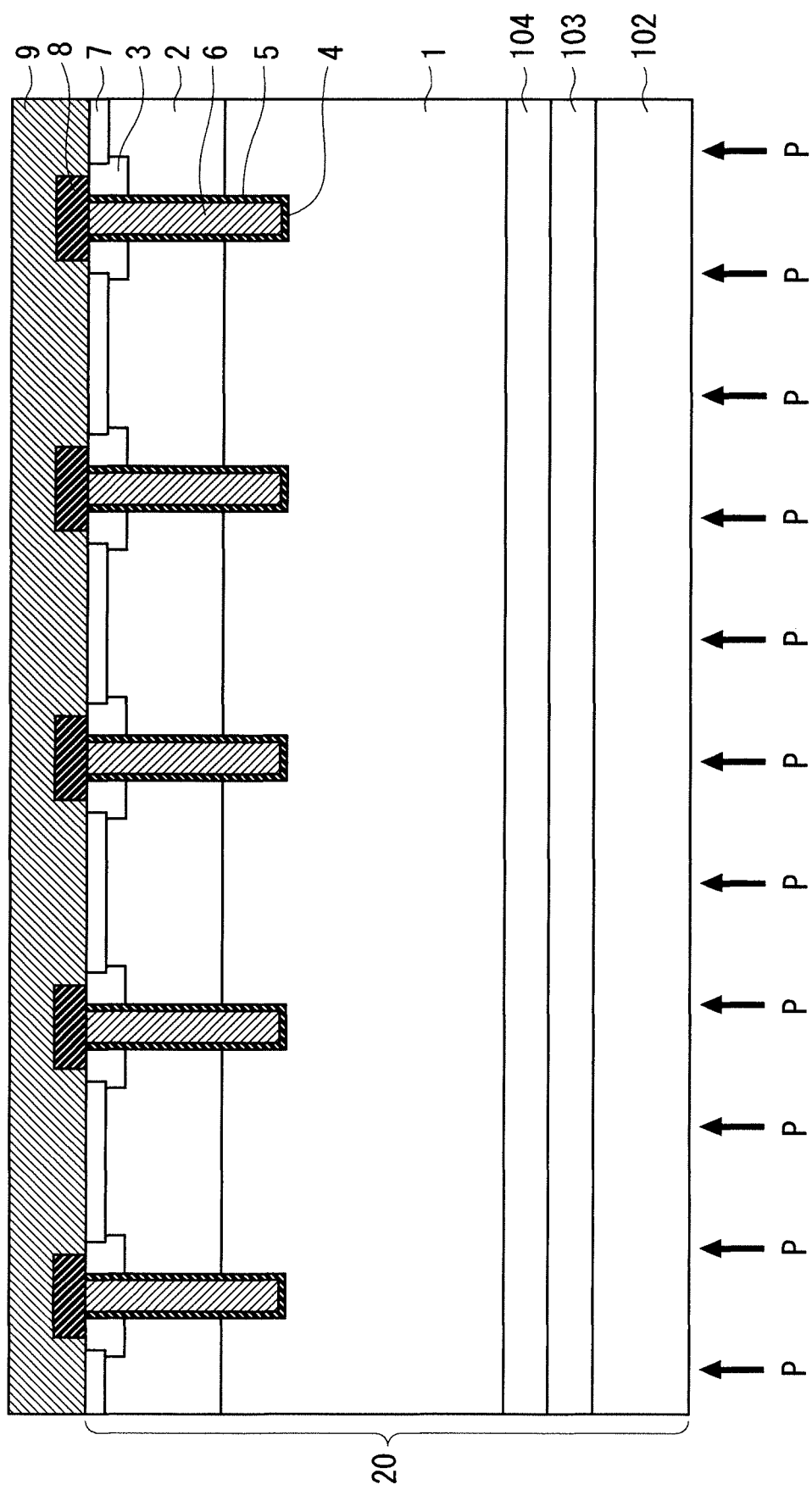
FIG. 14 is a drawing of a process of manufacturing the IGBT according to the embodiment 1.
Figure 15:
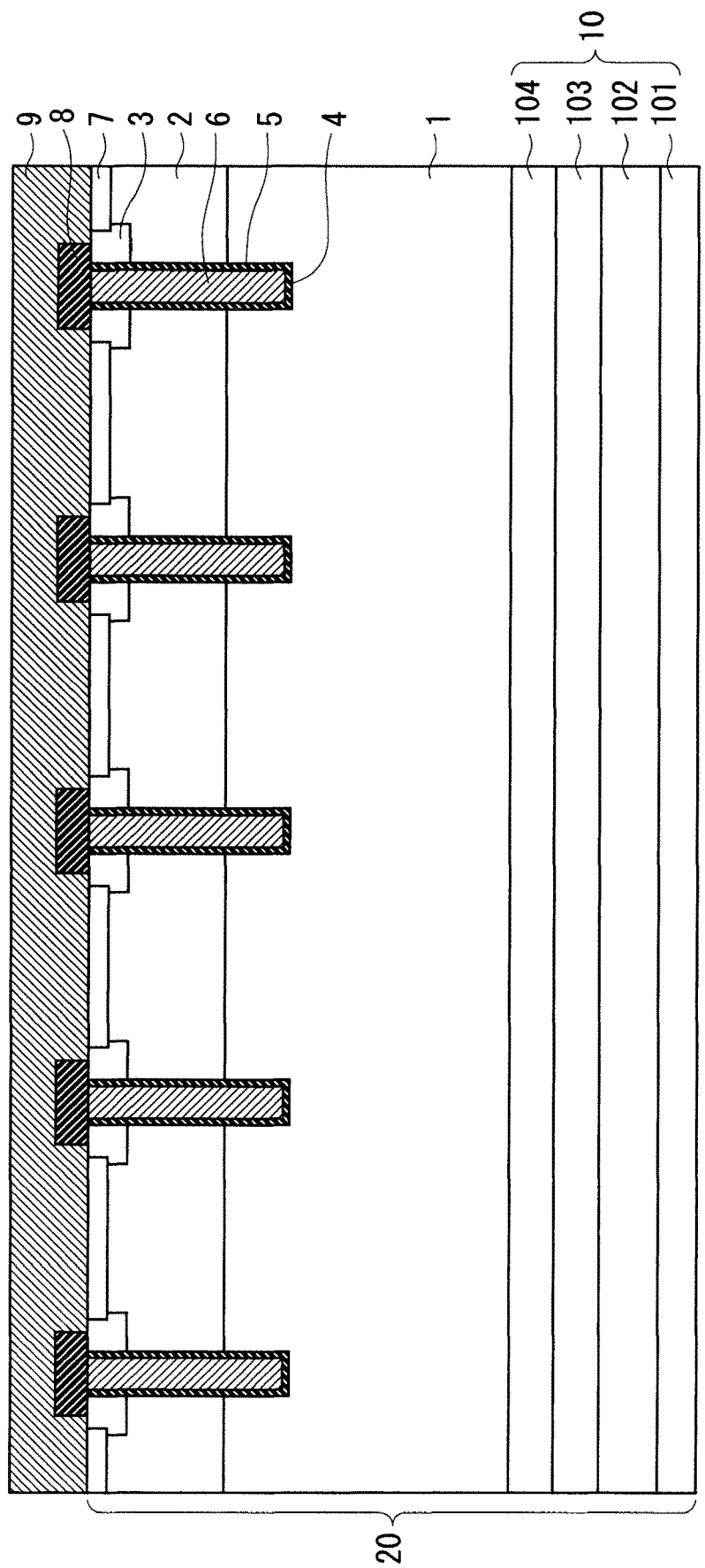
FIG. 15 is a drawing of a process of manufacturing the IGBT according to the embodiment 1.

Next, as illustrated in FIG. 14, phosphorus for forming the first buffer layer 101 is implanted from the rear surface of the semiconductor substrate 20. Then, the implanted phosphorus is activated by laser annealing. The first buffer layer 101 is thereby formed in a shallow position on the side of the rear surface of the semiconductor substrate 20.

Figure 16:
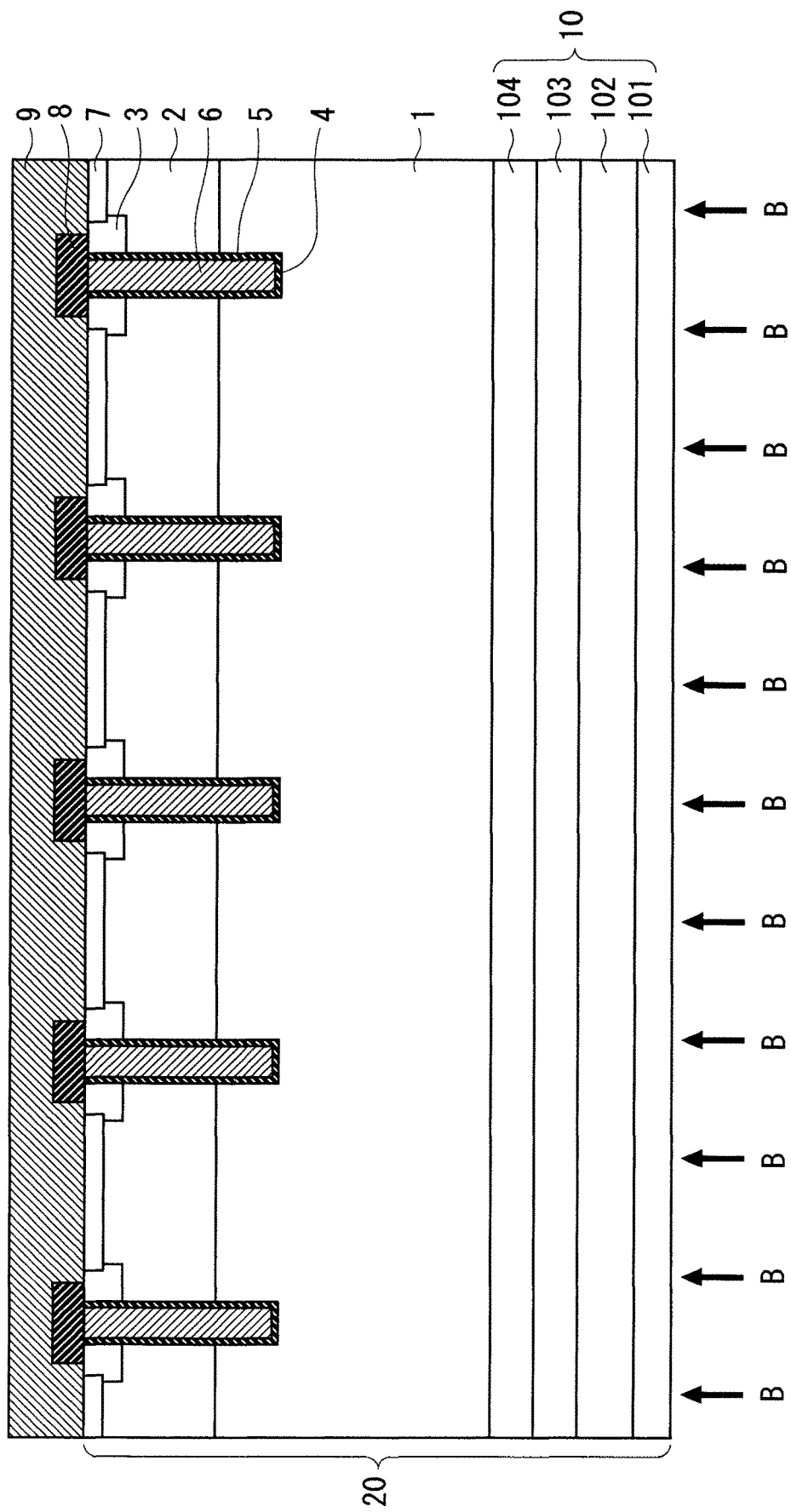
FIG. 16 is a drawing of a process of manufacturing the IGBT according to the embodiment 1.
Figure 17:
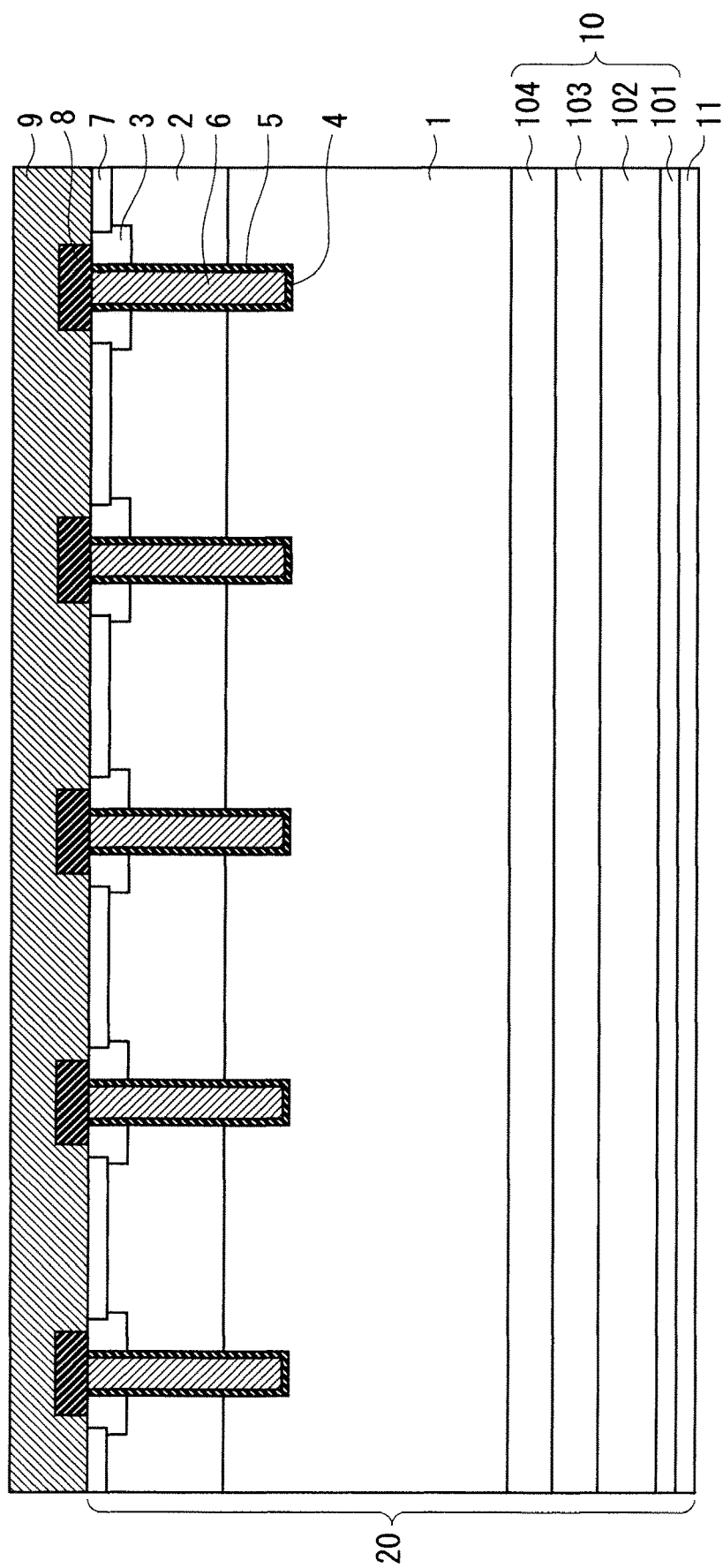
FIG. 17 is a drawing of a process of manufacturing the IGBT according to the embodiment 1.

Next, as illustrated in FIG. 16, boron for forming the P-type collector layer 11 is implanted from the rear surface of the semiconductor substrate 20. Then, the implanted boron is activated by laser annealing. The P-type collector layer 11 is thereby formed on the surface layer part on the side of the rear surface as illustrated in FIG. 17.

An order of performing the process of forming the second buffer layer 102, the third buffer layer 103, and the fourth buffer layer 104, the process of forming the first buffer layer 101, and the process of forming the P-type collector layer 11 may be rearranged, and it is sufficient that the processes are performed in a simple order in manufacturing.

Figure 18:
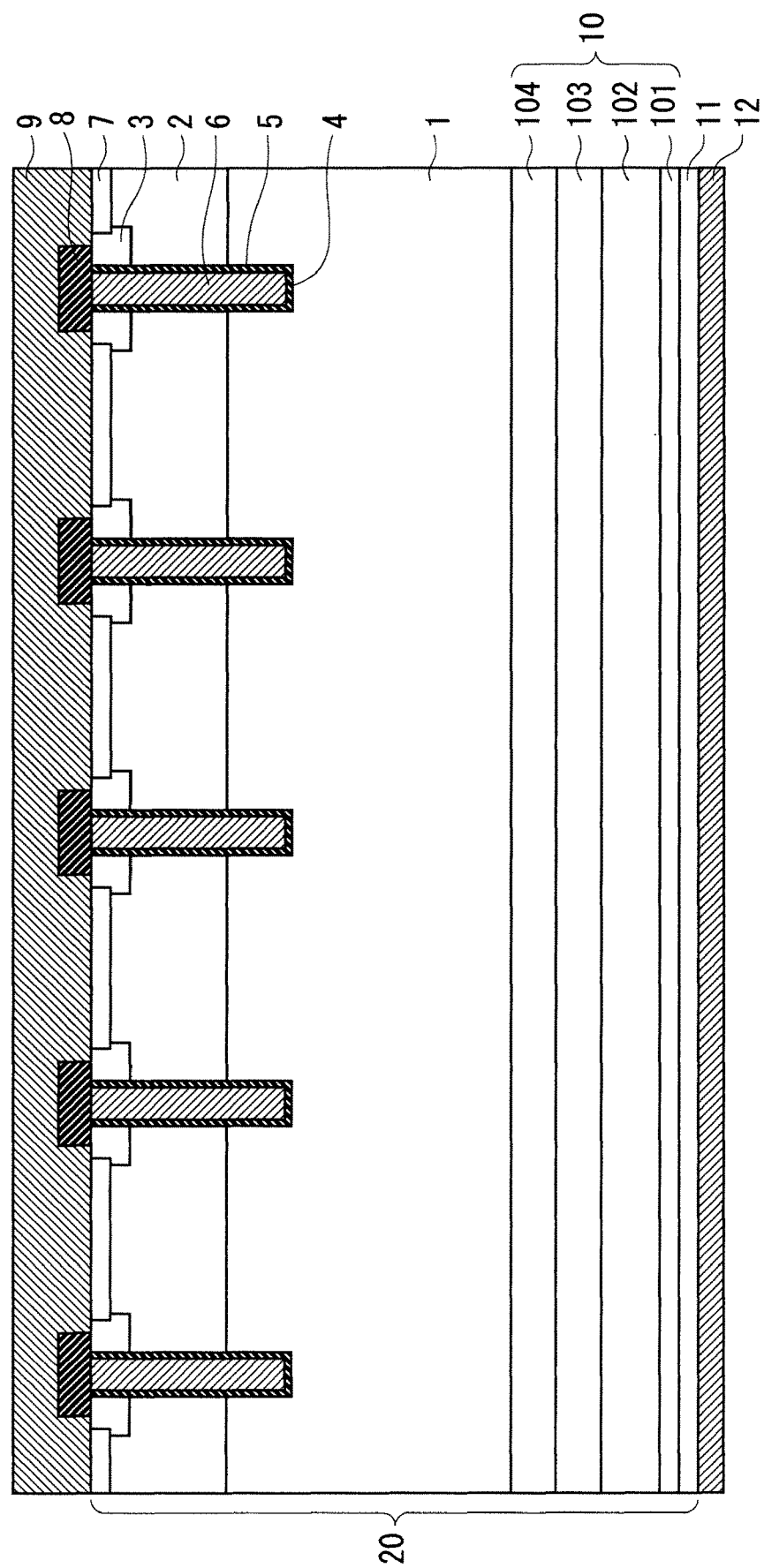
FIG. 18 is a drawing of a process of manufacturing the IGBT according to the embodiment 1.

Subsequently, a film of Al/Ti/Ni/Au or AlSi/Ti/Ni/Au, for example, is formed on the rear surface of the semiconductor substrate 20 by sputtering method to form the collector electrode 12 as illustrated in FIG. 18. Finally, thermal processing is performed to reduce a contact resistance of the P-type collector layer 11 and the collector electrode 12. The IGBT illustrated in FIG. 1 is thereby completed by the above processing.

As described above, according to the semiconductor device of the embodiment 1, the N-type buffer layer 10 includes the first buffer layer 101 formed using phosphorus, thus the concentration of proton in the second buffer layer 102, the third buffer layer 103, and the fourth buffer layer 104 formed using proton can be reduced, and the implantation amount of protons for forming the N-type buffer layer 10 can be reduced. The number of the first buffer layers 101, the second buffer layers 102, the third buffer layers 103, and the fourth buffer layers 104 and the distance therebetween are set as described above, thus the extension of the depletion layer can be gradually stopped, and the surge voltage at the time of turn off (at the time of applying the voltage) can be suppressed.

Although the illustration is omitted, the semiconductor device may be an IGBT having a structure that an N+-type carrier accumulation layer having a higher impurity peak concentration than the N-type drift layer 1 is provided between the P-type base layer 2 and the N-type drift layer 1, that is to say, a carrier stored trench-gate bipolar transistor (CSTBT).

Embodiment 2

Figure 19:
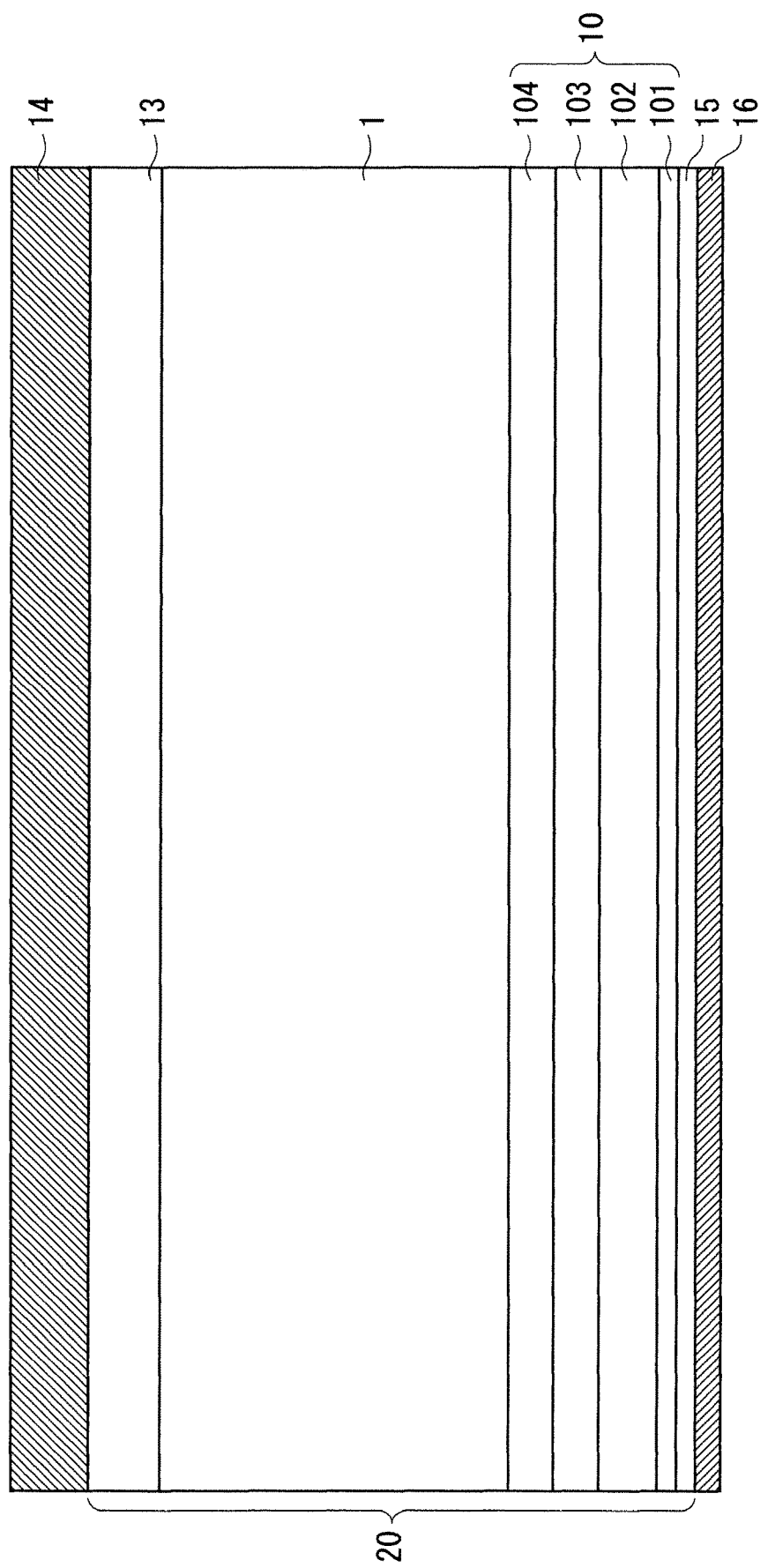
FIG. 19 is a cross-sectional view of a major part of a diode according to an embodiment 2.

The IGBT is described as the example of the semiconductor device in the embodiment 1, however, a diode is used as the semiconductor device in the embodiment 2. FIG. 19 is a cross-sectional view of a major part of a diode which is a semiconductor device according to the embodiment 2.

As illustrated in FIG. 19, a semiconductor substrate 20 constituting a diode has a P-type anode layer 13 on the side of the front surface of the N-type drift layer 1. An anode electrode 14 connected to the P-type anode layer 13 is formed on the front surface of the semiconductor substrate 20. The semiconductor substrate 20 includes the N-type buffer layer 10 similar to that in the embodiment 1, that is to say, the N-type buffer layer 10 made up of the first buffer layer 101, the second buffer layer 102, the third buffer layer 103, and the fourth buffer layer 104. The semiconductor substrate 20 further includes an N-type cathode layer 15 on the side of the rear surface of the N-type drift layer 1. A cathode electrode 16 connected to the N-type cathode layer 15 is formed on the rear surface of the semiconductor substrate 20.

Obtained according to the diode of the embodiment 2 is an effect that an oscillation at a time of recovery of the diode is suppressed as with the case where the oscillation of voltage at the time of turn off is suppressed in the IGBT according to the embodiment 1.

The structure on the side of the rear surface of the diode according to the embodiment 2 can be formed by the method similar to the method of forming the structure on the side of the rear surface of the IGBT described in the embodiment 1. That is to say, in the method of forming the structure on the side of the rear surface of the IGBT described in the embodiment 1, it is sufficient that the N-type cathode layer 15 is formed in place of the P-type collector layer 11, and the cathode electrode 16 is formed in place of the collector electrode 12 of the IGBT.

Although the illustration is omitted, the diode in FIG. 19 may also be provided with the trench 4, the gate insulating film 5, and the gate electrode 6 similar to those in FIG. 1 (the gate electrode 6 provided in the diode is a dummy gate electrode). In that case, the trench 4 is formed to pass through the P-type anode layer 13 and reach the N-type drift layer 1.

The diode in FIG. 19 is a PN junction diode, but may be a merged PiN Schottky (MPS) diode having an MPS structure in which a PN junction diode and a Schottky barrier diode are combined. In the diode in FIG. 19, the N-type cathode layer 15 is provided over the whole side of the rear surface of the first buffer layer 101, however, also applicable is a structure that an N-type cathode layer and a P-type cathode layer are alternately provided on the side of the rear surface of the first buffer layer 101. The semiconductor device may be a reverse conducting IGBT (RC-IGBT) in which a region where an IGBT is formed and a region where a diode is formed are provided in one semiconductor substrate 20. Also in such various types of diode, the N-type buffer layer 10 made up of the first buffer layer 101, the second buffer layer 102, the third buffer layer 103, and the fourth buffer layer 104 is provided, thus the effect of suppressing the oscillation at the time of recovery is obtained.

Each embodiment can be arbitrarily combined, or each embodiment can be appropriately varied or omitted.

While the disclosure has been shown and described in detail, the foregoing description is in all aspects illustrative and not restrictive. It is therefore understood that numerous modifications and variations can be devised.

What is claimed is:
1. A semiconductor device, comprising:
a drift layer of a first conductivity type provided between a first main surface and a second main surface of a semiconductor substrate; and
a buffer layer of a first conductivity type provided between the drift layer and the first main surface and having a higher impurity peak concentration than the drift layer, wherein
the buffer layer has a structure that a first buffer layer, a second buffer layer, a third buffer layer, and a fourth buffer layer are disposed in this order from a side of the first main surface, and
when a distance from an impurity peak position of the first buffer layer to an impurity peak position of the second buffer layer is L12 and a distance from an impurity peak position of the second buffer layer to an impurity peak position of the third buffer layer is L23, a relationship of $L23/L12 \geq 3.5$ is satisfied.

2. The semiconductor device according to claim 1, wherein
an impurity constituting the first buffer layer is phosphorus, and
an impurity constituting the second buffer layer, the third buffer layer, and the fourth buffer layer is proton.

3. The semiconductor device according to claim 1, wherein
when the impurity peak concentration of the second buffer layer is C2, the impurity peak concentration of the third buffer layer is C3, and the impurity peak concentration of the fourth buffer layer is C4, a relationship of $C2>C3>C4$ is satisfied.

4. The semiconductor device according to claim 1, wherein
the impurity peak concentration of each of the second buffer layer, the third buffer layer, and the fourth buffer layer is equal to or smaller than $2.0 \times 10^{15}/cm^3$.

5. The semiconductor device according to claim 1, wherein
when a distance from an impurity peak position of the third buffer layer to an impurity peak position of the fourth buffer layer is L34, a relationship of $L23/L34>1$ is satisfied.

6. The semiconductor device according to claim 1, wherein
withstand voltage is equal to or smaller than 750V, a specific resistance of the drift layer is equal to or larger than 20 Ω·cm and equal to or smaller than 40 Ω·cm, and a sum of a thickness of the drift layer and a thickness of the buffer layer is equal to or larger than 50 μm and equal to or smaller than 80 μm.

7. The semiconductor device according to claim 1, wherein
withstand voltage is 1200V, a specific resistance of the drift layer is equal to or larger than 50 Ω·cm and equal to or smaller than 90 Ω·cm, and a sum of a thickness of the drift layer and a thickness of the buffer layer is equal to or larger than 100 μm and equal to or smaller than 130 μm.

8. The semiconductor device according to claim 1, wherein
withstand voltage is 1700V, a specific resistance of the drift layer is equal to or larger than 90 Ω·cm and equal to or smaller than 130 Ω·cm, and a sum of a thickness of the drift layer and a thickness of the buffer layer is equal to or larger than 170 μm and equal to or smaller than 210 μm.

9. The semiconductor device according to claim 1, wherein
withstand voltage is 2000V, a specific resistance of the drift layer is equal to or larger than 130 Ω·cm and equal to or smaller than 180 Ω·cm, and a sum of a thickness of the drift layer and a thickness of the buffer layer is equal to or larger than 200 μm and equal to or smaller than 260 μm.

10. The semiconductor device according to claim 1, wherein
withstand voltage is 3300V, a specific resistance of the drift layer is equal to or larger than 200 Ω·cm and equal to or smaller than 350 Ω·cm, and a sum of a thickness of the drift layer and a thickness of the buffer layer is equal to or larger than 340 μm and equal to or smaller than 420 μm.

11. The semiconductor device according to claim 1, wherein
withstand voltage is 4500V, a specific resistance of the drift layer is equal to or larger than 300 Ω·cm and equal to or smaller than 450 Ω·cm, and a sum of a thickness of the drift layer and a thickness of the buffer layer is equal to or larger than 420 μm and equal to or smaller than 540 μm.

12. The semiconductor device according to claim 1, wherein
withstand voltage is 6500V, a specific resistance of the drift layer is equal to or larger than 600 Ω·cm and equal to or smaller than 900 Ω·cm, and a sum of a thickness of the drift layer and a thickness of the buffer layer is equal to or larger than 580 μm and equal to or smaller than 720 μm.

* * * * *